United States Patent
Chikawa et al.

[11] Patent Number: 5,310,699
[45] Date of Patent: May 10, 1994

[54] METHOD OF MANUFACTURING A BUMP ELECTRODE

[75] Inventors: Yasunori Chikawa; Shigeyuki Sasaki; Katsunobu Mori; Takamichi Maeda, all of Nara; Masao Hayakawa, Kyoto, all of Japan

[73] Assignee: Sharp Kabushiki Kaisha, Osaka, Japan

[21] Appl. No.: 905,683

[22] Filed: Jun. 29, 1992

Related U.S. Application Data

[63] Continuation-in-part of Ser. No. 587,669, Sep. 25, 1990, abandoned, which is a continuation of Ser. No. 449,242, Dec. 7, 1989, abandoned, which is a continuation of Ser. No. 298,775, Jan. 17, 1989, abandoned, which is a continuation of Ser. No. 77,992, Jul. 24, 1987, abandoned, which is a continuation of Ser. No. 873,469, Jun. 9, 1986, abandoned, which is a continuation of Ser. No. 760,261, Jul. 29, 1985, abandoned.

[30] Foreign Application Priority Data

Aug. 28, 1984 [JP] Japan ................... 59-181291

[51] Int. Cl.[5] .......... H01L 21/28; H01L 21/447; H01L 21/92
[52] U.S. Cl. .................. 437/183; 437/189; 437/192; 437/194
[58] Field of Search ............. 437/183, 189, 192, 194

[56] References Cited

U.S. PATENT DOCUMENTS

| | | |
|---|---|---|
| 3,540,988 | 11/1970 | Wells et al. |
| 3,625,837 | 12/1971 | Nelson et al. |
| 3,809,625 | 5/1974 | Brown et al. |
| 3,874,072 | 4/1975 | Rose et al. |
| 4,182,781 | 1/1980 | Hooper et al. |
| 4,205,099 | 5/1980 | Jones et al. |
| 4,293,637 | 10/1981 | Hatada et al. |
| 4,789,647 | 12/1988 | Peters |
| 4,914,057 | 4/1990 | Gloton |
| 4,950,623 | 8/1990 | Dishon |

FOREIGN PATENT DOCUMENTS

| | | | |
|---|---|---|---|
| 52-155056 | 12/1977 | Japan | |
| 54-162458 | 12/1979 | Japan | |
| 57-139943 | 8/1982 | Japan | |
| 58-102542 | 6/1983 | Japan | |
| 58-143554 | 8/1983 | Japan | 437/183 |
| 58-192351 | 11/1983 | Japan | |
| 59-110169 | 6/1984 | Japan | |

Primary Examiner—Mary Wilczewski
Attorney, Agent, or Firm—Morrison & Foerster

[57] ABSTRACT

A method of manufacturing a semiconductor device with a bump-electrode of gold crystal is disclosed. The method includes providing a semiconductor substrate, an insulative layer, an electrode section, passivation layer on the edge portion of the electrode section, a multi-layer film, and a bump electrode of gold crystal. The method further includes heat treatment of the bump electrode to form an anticorrosive layer between the electrode section and the lower layer of the multi-layer film. Removing the unnecessary multi-layer film, the anticorrosive layer is used as a mask for etching to simplify the process of manufacturing the semiconductor device.

12 Claims, 4 Drawing Sheets

METHOD OF MANUFACTURING A BUMP ELECTRODE

CROSS-REFERENCE TO RELATED APPLICATIONS

This application is a continuation-in-part of our earlier filed U.S. patent application Ser. No. 07/587,669, filed on Sep. 25, 1990 (now abandoned), which is a continuation of U.S. patent application Ser. No. 07/449,242, filed on Dec. 7, 1989 (now abandoned), which is a continuation of U.S. patent application Ser. No. 07/298,775, filed on Jan. 17, 1989 (now abandoned), which is a continuation of U.S. patent application Ser. No. 07/077,992, filed on Jul. 24, 1987 (now abandoned), which is a continuation of U.S. patent application Ser. No. 06/873,469, filed on Jun. 9, 1986 (now abandoned), which is a continuation of U.S. patent application Ser. No. 06/760,261, filed on Jul. 29, 1985 (now abandoned), all of which applications are incorporated herein by reference and to which applications we claim priority under 35 U.S.C. §120. Further, the above U.S. patent applications claim priority based on Japanese patent application No. 59-181291, filed Aug. 28, 1984 under 35 U.S.C. §119.

FIELD OF THE INVENTION

This invention relates to a method of manufacturing semiconductor devices and more particularly to a method of manufacturing a bump electrode for external connection.

BACKGROUND OF THE INVENTION

When use is made of a semiconductor chip with circuit elements formed thereon for large scale integration, etc., it is necessary to connect these circuit elements to external circuits. Electrodes are therefore provided on the chip and lead wires for making connections to external circuits are bonded to these electrodes. FIGS. 1A, 1B, 1C and 1D show a cross-sectional schematic view of a section to the semiconductor substrate showing steps in the manufacturing process of the conventional invention.

The process includes first providing a semiconductor substrate 10 such as silicon which includes a plurality of circuit elements and an insulative layer 11 such as $SiO_2$ formed on the surface of the substrate. An electrode section 12 such as aluminum is then formed on the insulative layer and the electrode section is electrically connected to the circuit elements. A passivation layer 13 is then formed on the insulative layer 11 on an edge portion of the electrode section 12. The center region on the surface of the electrode section 12 is exposed to form a concave portion (FIG. 1A). A first photoresist layer 14 is then formed on the passivation layer 13. A multi-layer film 15 is then formed on the whole surface in a manner so as to cover the exposed electrode section 12. The multi-layer film includes at least two layers such as gold-titanium tungsten (FIG. 1B). A second photoresist layer 16 with a predetermined thickness necessary for forming a bump electrode on the multi-layer film 15 is formed on the multi-layer film 15 over the electrode section 12 and the passivation layer 13 and the first photoresist layer 14. The edge of the second photoresist layer 16 is inside the concave portion of the electrode section 12, and is outside the edge of the multi-layer film 15 over the first photoresist layer 14. A bump electrode 17 of gold crystal is formed on the multi-layer film 15 over the electrode section 12 by electroplating in a manner such that the surface of the bump electrode 17 is controlled to be lower than or equal to the surface of the second photoresist layer 16 (FIG. 1C). The thickness of the photoresist 16 is desired to be the same thickness as the thickness of the bump electrode formed in the later process, but since it is difficult to make the thickness of the bump electrode exactly equal to the surface of the photoresist 16, the thickness of the bump electrode is made actually lower than the thickness of the photoresist 16 in about 2 $\mu$m as shown in FIG. 1C. The semiconductor substrate on which the photoresist pattern is formed are dipped in isopropyl alcohol and removed from the device by applying ultrasonic waves, and the multi-layer film 15 above and both sides of the passivation layer 13 are removed by ultrasonic waves in isopropyl alcohol (FIG. 1D). The bump electrode is then subjected to a heat treatment in an inactive atmosphere.

This process for manufacturing the conventional semiconductor device with a bump-electrode of gold crystal has the following drawbacks.

(1) It needs two photo-process and is very complex.

(2) The unnecessary multi-layer metal film cannot always be removed completely (especially when the thickness of the film is 1 $\mu$m or more).

(3) Sputtering cannot be used to form a multilayer metal film so that vapor deposition must be used. (If a multi-layer metal film is formed by sputtering, the temperature of the wafer is raised up to about 300° C. so that the photoresist layer will be ashed.)

SUMMARY OF INVENTION

A method of manufacturing a semiconductor device with a bump-electrode of gold crystal is disclosed. The method includes first providing a semiconductor substrate which includes a plurality of circuit elements and an insulative layer formed on the surface of the substrate. An electrode section is then formed on the insulative layer and the electrode section is electrically connected to the circuit elements. A passivation layer is then formed on the insulative layer on an edge portion of the electrode section. The center region on the surface of the electrode section is exposed to form a concave portion. A multi-layer film is then formed in a manner so as to cover on the whole surface of the semiconductor substrate inclusive of the exposed part of the electrode section. The multi-layer film includes at least two layers. A lower layer has good adhesion to the electrode section and also serves as a barrier between the bump electrode and the electrode section so as to prevent mutual diffusion between them, and an upper layer is comprised of a metal having good adhesion to the bump electrode of gold crystals. A photoresist layer with a predetermined thickness necessary for forming a bump electrode on the multi-layer film is formed on the multi-layer film over the electrode section and the passivation layer. The edge of the photoresist layer is inside the concave portion of the electrode section, and is outside the edge of the multi-layer film over the passivation layer. A bump electrode of gold crystal is formed on the multi-layer film over the electrode section by electroplating in a manner such that the surface of the bump electrode is controlled to be lower than or equal to the surface of the photoresist layer 9. The thickness of the photoresist is desired to be the same thickness as the thickness of the bump electrode formed in the later process, but since it is difficult to make the thickness of the bump electrode exactly equal to the surface of the photoresist, the thickness of the bump electrode is made actually lower than the thickness of the photoresist in about 2 μm as shown in FIG. 2D. Any photoresist is then removed and the bump electrode is subjected to a stress-reducing heat treatment so that an anticorrosive layer is formed by the reaction of a part of the electrode section with a part of the lower layer of the multi-layer film. Lastly, etching is used to remove the multi-layer film completely from areas unoccupied by the bump electrode by using not only the bump electrode as a mask for etching the multi-layer film but also using the anticorrosive alloy layer as a mask for protecting the electrode section.

The method of manufacturing a semiconductor device with a bump-electrode of gold crystal of the present invention can make the following objectives possible to (1) simplify the process since the photo-process is only a one step process; (2) remove the unnecessary multi-layer metal film completely (especially when the thickness of the film is 1 μm or more); and (3) sputtering can be used to form the multi-layer metal film. The advantages of using sputtering are as follows:

(1) Reverse sputtering can be used.

(2) Good ohmic contact can be obtained even if there is a thin oxide film on the surface of the target film.

These and other objects, advantages and features of the present invention will become apparent to those persons skilled in the art upon reading the details of the structure and methods of manufacturing as more fully set forth below, reference being made to the accompanying drawings forming a part hereof.

DETAILED DESCRIPTION OF THE DRAWINGS

The present invention will be better understood from the detailed description given herein below and the accompanying drawings which are given by way of illustration only, and thus are not limitative of the present invention in which.

DETAILED DESCRIPTION OF PREFERRED EMBODIMENTS

Before the present methods of manufacturing semiconductor devices are disclosed it is to be understood that this invention is not limited to the particular methods and components described as such methodology and materials may, of course, vary. It is also to be understood that the terminology used herein is for the purpose of describing particular embodiments only, and is not intended to be limiting since the scope of the present invention will be limited only by the appended claims.

Figure 1A:
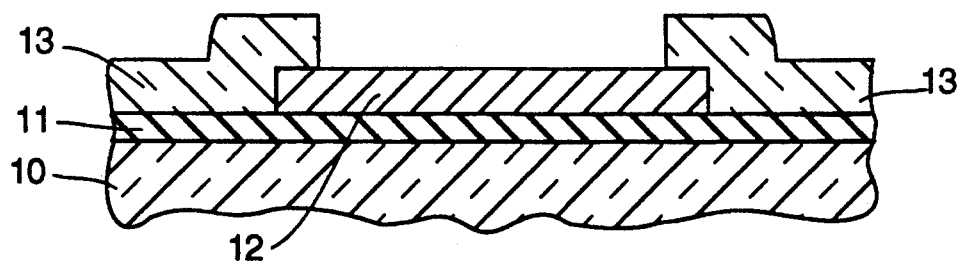
FIGS. 1A, 1B, 1C and 1D show a cross-sectional schematic view of a section to the semiconductor substrate showing steps in manufacturing process of the conventional invention.
Figure 1B:
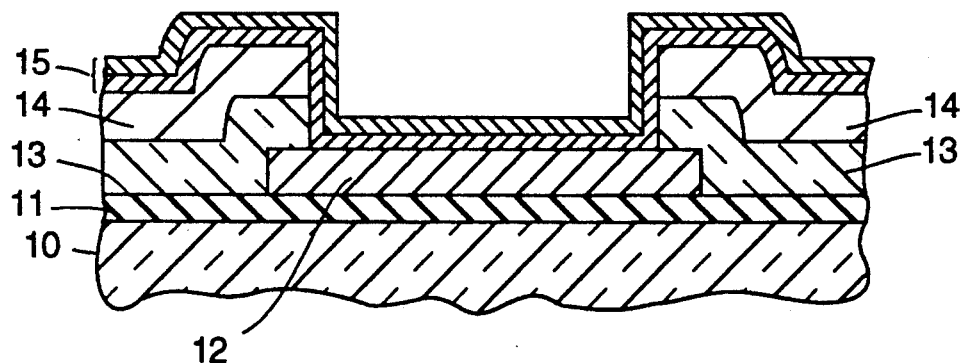
Figure 1C:
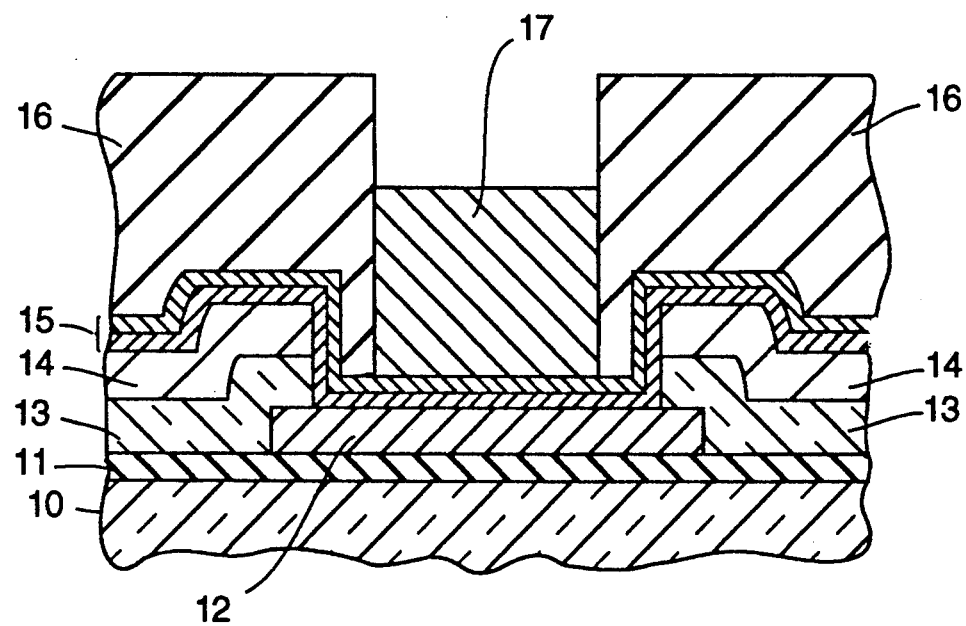
Figure 1D:
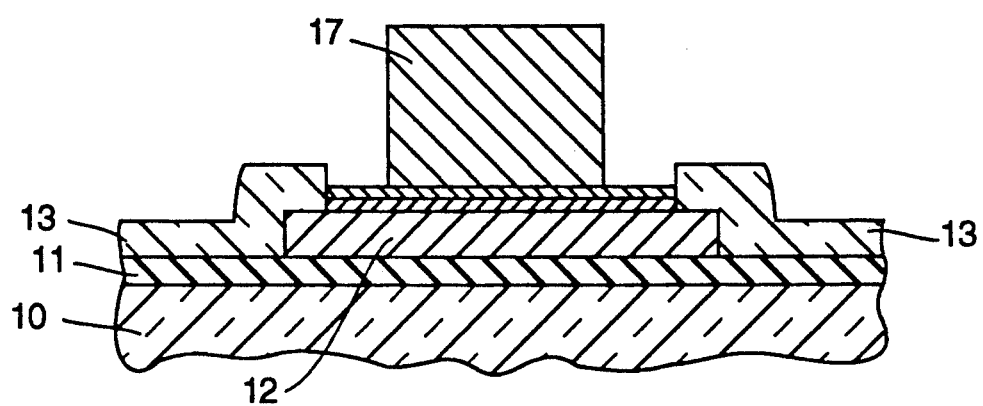
Figure 2A:
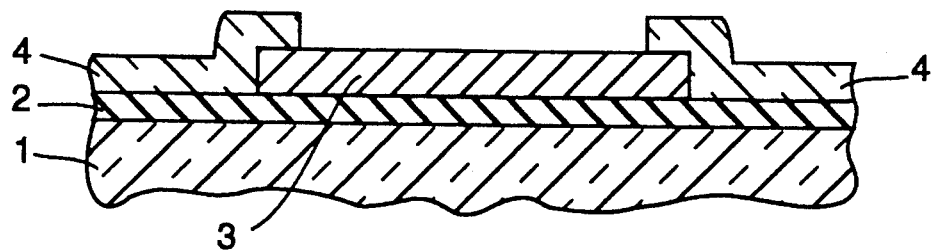
FIGS. 2A, 2B, 2C, 2D, 2E and 2F show a cross-sectional schematic view of a section of the semiconductor substrate showing steps in the manufacturing process of the invention.

In FIG. 2A, which is a schematic cross sectional view of a portion of a semiconductor substrate, a silicon semiconductor substrate 1 includes circuit elements and its surface is covered by an insulative layer 2 such as an oxide layer. On the surface of the semiconductor substrate covered with the insulative layer 2, there is an electrode 3 for connection with an external circuit. The electrode 3 is electrically connected to the aforementioned circuit elements and is formed by a sputtered aluminum-silicon or aluminum layer of about 1 μm together with conductor the elements.

Figure 2B:
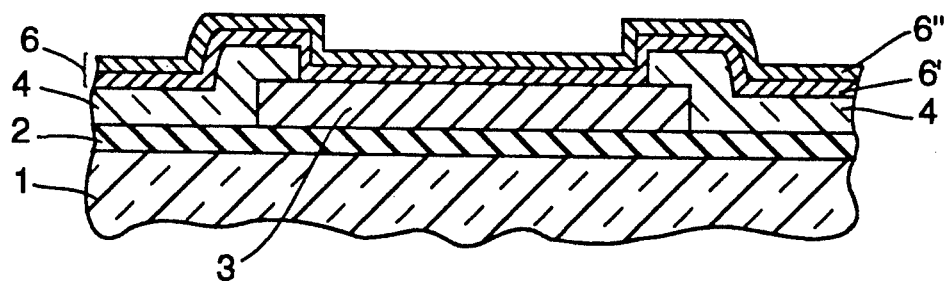

The surface of the semiconductor substrate, where the electrode 3 is formed, is covered and protected by a passivation layer 4 of phospho-silicate glass (PSG) or the like. A passivation layer is then formed on the insulative layer on an edge portion of the electrode section. The center region on the surface of the electrode section is exposed to form a concave portion as shown in FIG. 2A. Next, there is a multi-layer film 6 formed, for example, by sputtering on the whole surface of the semiconductor chip inclusive of the exposed part of the aluminum electrode 3 as shown in FIG. 2B. The multi-layer film 6 comprises a lower film 6' and an upper film 6''. This lower film 6' is adapted to serve not only as a film with good adhesion to the electrode section but also as a barrier between the bump electrode and the aluminum electrode 3 so as to prevent mutual diffusion between them. This lower film 6' is titanium tungsten, and the thickness of the film is 2000 to 5000 Å, preferably 3000 Å. The upper film 6'' is a film with good adhesion to the bump electrode. This metallic film 6'' is gold, and the thickness of the film is 1000 to 2000 Å, preferably 1000 Å. The gold film is formed sequentially after titanium tungsten film was formed.

Figure 2C:
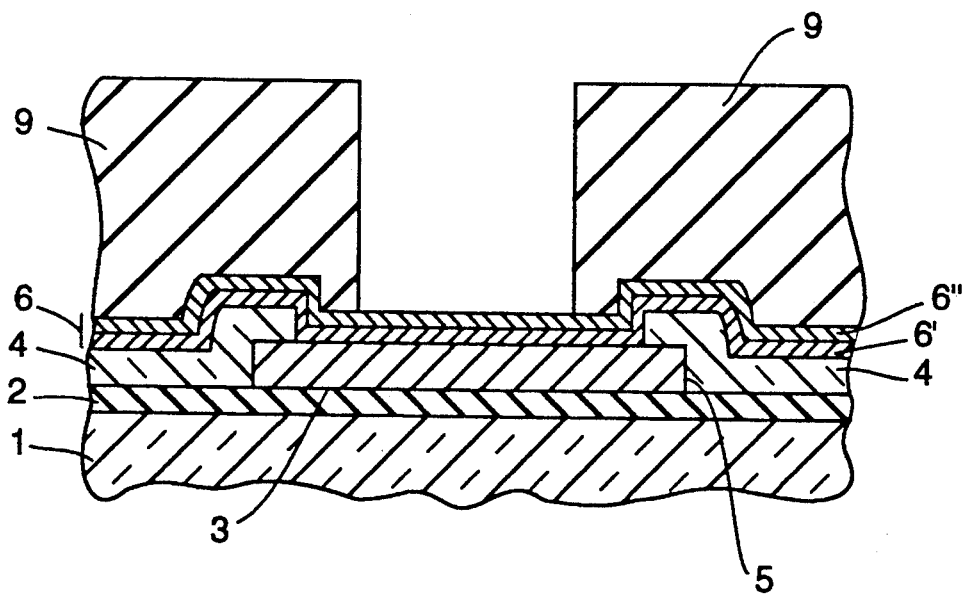

The multi-layer film 6 is masked by a photoresist layer 9 as shown in FIG. 2C excluding at least the section where a bump electrode is formed by electroplating with a material such as gold. The thickness of the photoresist is 20 to 25 μm. The area of the region of said multi-layer film 6 that is not covered with said photoresist layer is smaller than the center region where the edge of the photoresist layer is inside the concave portion of the electrode section, and is outside the edge of the multi-layer film over the passivation layer.

Figure 2D:
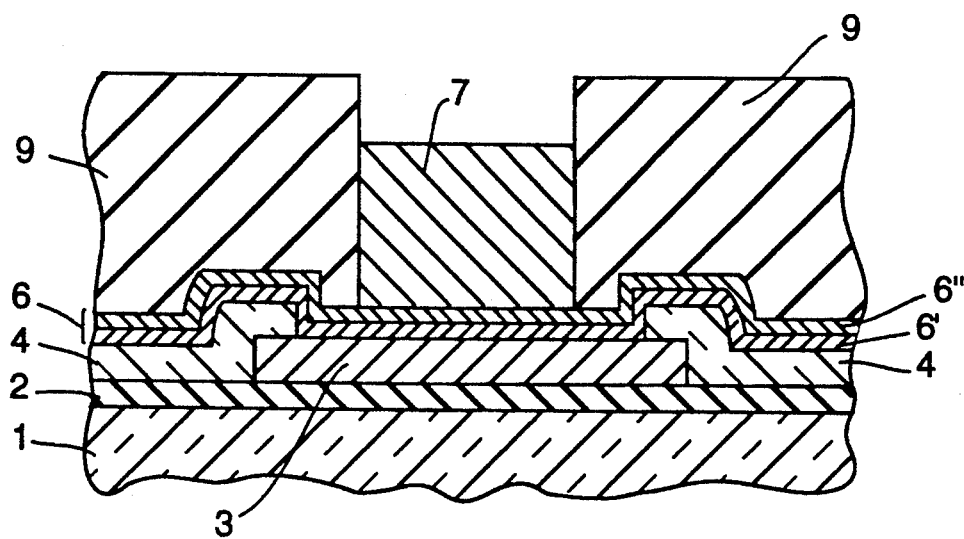
Figure 2E:
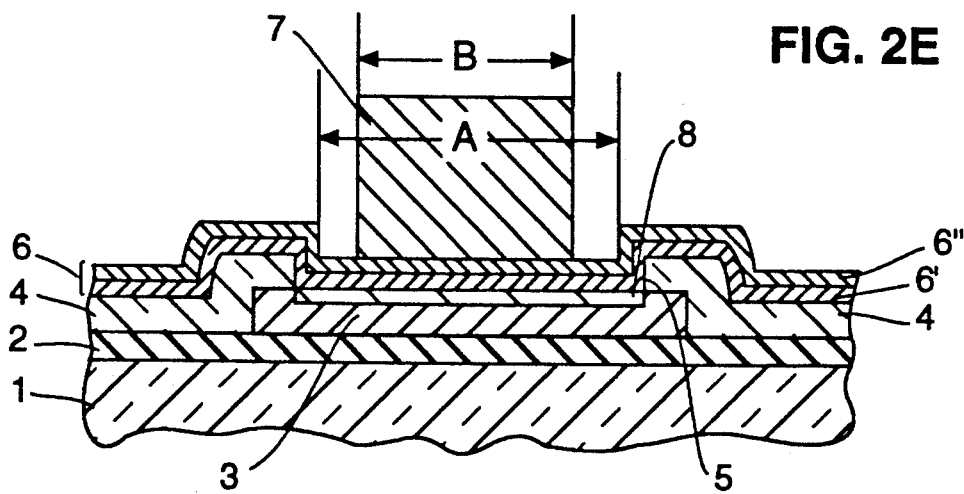

As shown in FIG. 2E, the opening is formed so that the dimension B of the bottom surface of the bump electrode 7 is smaller than the dimension A which is the length between the both edges of gold film (an upper layer 6'').

A bump electrode is formed by electroplating with a material such as gold as shown in FIG. 2D. The thickness of the bump electrode such as gold is 10 to 25 μm, preferably 20 μm. The preferable thickness of the photoresist layer is 22 μm, and its thickness may be the same thickness as that of the bump electrode.

Figure 2F:
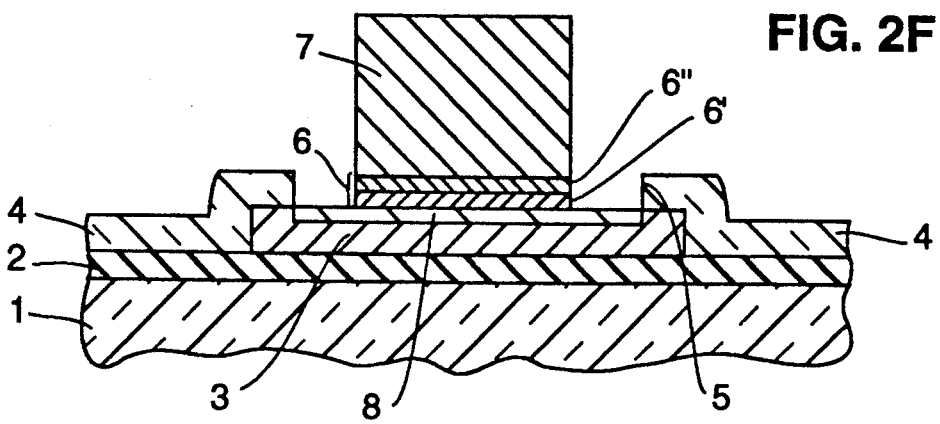

After the bump electrode 7 is formed as shown in FIG. 2D, the photoresist 9 is removed. The bump electrode 7 is subjected to a heat treatment in an atmosphere of $N_2$, for example, at about 400° C. to about 450° C., for about 10 minutes to about 2 hours, preferably about 300° C. for about 30 minutes so that an anticorrosive layer 8 is formed by the reaction of a part of the electrode 7 with a part of the lower layer of the multi-layer film 6. As shown in FIG. 2E, the thickness of the anticorrosive layer 8 being at least several hundred Å, in order to reduce crystal instability which comes about at the time of formation by electroplating and to remove internal stress. Etching is used to remove the gold film 6'' completely from areas unoccupied by the bump electrode using a 1N concentration of iodine solution. Then, etching is used to remove the titanium tungsten film 6' completely from areas unoccupied by the bump electrode using oxygenated water, as shown in FIG. 2F.

In the above mentioned embodiment, an upper layer of gold film 6″ can be replaced with another metal with good adhesion to the bump electrode gold film such as platinum.

In the above mentioned embodiment, a lower layer of titanium tungsten film 6′ can be replaced with a material, which may be a barrier to prevent mutual diffusion between the bump electrode and the aluminum electrode and has good adhesion to the aluminum electrode, such as titanium and titanium nitride. When an upper layer does not have good adhesion to a lower layer, an intermediate layer can be added to form a three-layered structure, for example, gold-nickel-chromium and platinum-nickel-chromium. The thickness of the intermediate layer such as Ni is 2000 to 4000 Å, preferably 2500 Å.

With respect to the preferable etching solution, aqua regia is for platinum; ferric chloride is for copper; oxygenated water is for titanium, titanium nitride and titanium tungsten; and a mixed solution of sec. cerium ammonium sulfate and perchloric acid is for chromium.

Unless defined otherwise, all technical and scientific terms used herein have the same meaning as commonly understood by one of ordinary skill in the art to which this invention belongs—specifically to the art of manufacturing semiconductor devices. Although any methods and materials similar or equivalent to those described herein can be used in the practice or testing of the present invention, the preferred methods and materials have been described. Further, all publications mentioned are incorporated herein by reference.

We claim:

1. A method of manufacturing a semiconductor device with a bump electrode of gold crystals, comprising the steps of
    providing a semiconductor substrate including a plurality of circuit elements and an insulative layer formed on the surface thereof,
    forming an electrode section on said insulative layer, wherein said electrode section is electrically connected to said circuit elements,
    forming a passivation layer on said insulative layer and on an edge portion of said electrode section, wherein the center region on the surface of said electrode section is exposed to form a concave portion,
    forming a multi-layer film covering the whole surface of the semiconductor substrate inclusive of the exposed part of the electrode section, which comprises at least a two-layer material, including a lower layer which is a material with good adhesion to said electrode section and serves as a barrier to prevent mutual diffusion between the bump electrode and the electrode section, and an upper layer which is a metal with good adhesion to said bump electrode of gold crystals,
    forming a masking material with a thickness necessary for forming a bump electrode on said multi-layer film excluding a region which is inside the concave portion wherein the area of the region of said multi-layer film that is not covered with said masking material is smaller than the center region where the edge of the photoresist layer is inside the concave portion of the electrode section, and is outside the edge of the multi-layer film over the passivation layer,
    forming a bump electrode of gold crystals with the surface of the bump electrode lower than or equal to the surface of said masking material on said electrode section by electroplating,
    thereafter removing the masking material,
    thereafter subjecting said bump electrode to a stress-reducing heat treatment, wherein an anticorrosive alloy layer is formed by the reaction of a part of the electrode section with a part of the lower layer of the multi-layer film, and
    thereafter removing by etching said multi-layer film completely from areas unoccupied by said bump electrode by using not only said bump electrode as a mask for etching said multi-layer film but also said anticorrosive alloy layer as a mask for protecting said electrode section,
wherein said lower layer of said multi-layer film is selected from the group consisting of titanium nitride and titanium tungsten.

2. The method of claim 1, wherein the thickness of said multi-layer film is 2000–5000 Å.

3. The method of claim 1, wherein an intermediate layer is formed between the lower layer and the upper layer in order to improve adhesion in the case of poor adhesion between them.

4. The method of claim 3, wherein said intermediate layer is comprised of a metal selected from the group consisting of copper, nickel and tungsten.

5. The method of claim 4, wherein the thickness of said intermediate layer is 2000–4000 Å.

6. The method of claim 1, wherein said bump electrode is subjected to a heat treatment at 300°–450° C for 10 minutes–2 hours.

7. The method of claim 1, wherein said multi-layer film is formed by sputtering.

8. The method of claim 1, wherein said insulative layer comprises an oxide.

9. The method of claim 1, wherein said semiconductor substrate comprises silicon.

10. The method of claim 1, wherein said upper layer of the multi-layer film is a deposited layer of a metal selected from the group consisting of gold and platinum.

11. The method of claim 10, wherein the thickness of said upper layer of the multi-layer film is 1000–2000 Å.

12. The method of claim 1, wherein said electrode section comprises aluminum and aluminum silicon.

* * * * *